(12) United States Patent
Robinson et al.

(10) Patent No.: US 7,535,109 B2
(45) Date of Patent: *May 19, 2009

(54) DIE ASSEMBLY HAVING ELECTRICAL INTERCONNECT

(75) Inventors: Marc E. Robinson, San Jose, CA (US); Alfons Vindasius, Saratoga, CA (US); Donald Almen, San Martin, CA (US); Larry Jacobsen, Bend, OR (US)

(73) Assignee: Vertical Circuits, Inc., Scotts Valley, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/744,153

(22) Filed: May 3, 2007

(65) Prior Publication Data

US 2007/0252262 A1    Nov. 1, 2007

Related U.S. Application Data

(63) Continuation of application No. 11/097,829, filed on Mar. 31, 2005, now Pat. No. 7,245,021.

(60) Provisional application No. 60/561,848, filed on Apr. 13, 2004.

(51) Int. Cl.
  *H01L 23/48* (2006.01)
  *H01L 23/52* (2006.01)
  *H01L 29/40* (2006.01)

(52) U.S. Cl. ........................ 257/777; 257/686

(58) Field of Classification Search ............... 257/686, 257/777, 666, 668

See application file for complete search history.

(56) References Cited

U.S. PATENT DOCUMENTS 3,648,131 A   3/1972  Stuby 4,074,342 A   2/1978  Honn et al.

(Continued)

FOREIGN PATENT DOCUMENTS

| EP | 0314437 | 5/1989 |
|---|---|---|
| EP | 1763894 A0 | 10/2005 |
| JP | 63056925 | 3/1988 |
| JP | 64035528 | 2/1989 |
| JP | 02133936 | 5/1990 |
| WO | 9323982 | 11/1993 |
| WO | 9909599 | 2/1999 |
| WO | 0164344 | 9/2001 |

OTHER PUBLICATIONS

European Search Report relating to EP Application No. 05735136.3 dated Jun. 5, 2008.

*Primary Examiner*—Phat X Cao
(74) *Attorney, Agent, or Firm*—Haynes Beffel & Wolfeld LLP

(57) ABSTRACT

The present invention provides an apparatus for vertically interconnecting semiconductor die, integrated circuit die, or multiple die segments. Metal rerouting interconnects which extend to one or more sides of the die or segment can be optionally added to the die or multi die segment to provide edge bonding pads upon the surface of the die for external electrical connection points. After the metal rerouting interconnect has been added to the die on the wafer, the wafer is optionally thinned and each die or multiple die segment is singulated from the wafer by cutting or other appropriate singulation method. After the die or multiple die segments are singulated or cut from the wafer, insulation is applied to all surfaces of the die or multiple die segments, openings are made in the insulation above the desired electrical connection pads, and the die or multiple die segments are placed on top of one another to form a stack. Vertically adjacent segments in the stack are electrically interconnected by attaching a short flexible bond wire or bond ribbon to the exposed electrical connection pad at the peripheral edges of the die which protrudes horizontally from the die and applying electrically conductive polymer, or epoxy, filaments or lines to one or more sides of the stack.

54 Claims, 6 Drawing Sheets

4-High *micropede* VIP
Cross Section

U.S. PATENT DOCUMENTS

| | | |
|---|---|---|
| 4,323,914 A | 4/1982 | Berndlmaier et al. |
| 4,525,921 A | 7/1985 | Carson et al. |
| 4,545,840 A | 10/1985 | Newman et al. |
| 4,646,128 A | 2/1987 | Carson et al. |
| 4,659,931 A | 4/1987 | Schmitz et al. |
| 4,672,737 A | 6/1987 | Carson et al. |
| 4,703,170 A | 10/1987 | Schmitz |
| 4,706,166 A | 11/1987 | Go |
| 4,761,681 A | 8/1988 | Reid |
| 4,764,846 A | 8/1988 | Go |
| 4,818,823 A | 4/1989 | Bradley |
| 4,862,249 A | 8/1989 | Carlson |
| 4,894,706 A | 1/1990 | Sato et al. |
| 4,897,708 A | 1/1990 | Clements |
| 4,939,568 A | 7/1990 | Kato et al. |
| 4,941,033 A | 7/1990 | Kishida |
| 4,954,875 A | 9/1990 | Clements |
| 4,956,694 A | 9/1990 | Eide |
| 4,956,695 A | 9/1990 | Robinson et al. |
| 4,959,749 A | 9/1990 | Dzarnoski, Jr. et al. |
| 4,983,533 A | 1/1991 | Go |
| 4,996,583 A | 2/1991 | Hatada et al. |
| 5,013,687 A | 5/1991 | Solomon |
| 5,019,943 A | 5/1991 | Fassbender et al. |
| 5,025,306 A | 6/1991 | Johnson et al. |
| 5,028,986 A | 7/1991 | Sugano et al. |
| 5,075,253 A | 12/1991 | Sliwa, Jr. |
| 5,093,708 A | 3/1992 | Solomon |
| 5,104,820 A | 4/1992 | Go, deceased et al. |
| 5,111,278 A | 5/1992 | Eichelberger |
| 5,117,282 A | 5/1992 | Salatino |
| 5,135,556 A | 8/1992 | Hornback et al. |
| 5,138,437 A | 8/1992 | Kumamoto et al. |
| 5,146,308 A | 9/1992 | Chance et al. |
| 5,172,303 A | 12/1992 | Bernardoni et al. |
| 5,191,405 A | 3/1993 | Tomita et al. |
| 5,198,888 A | 3/1993 | Sugano et al. |
| 5,202,754 A | 4/1993 | Bertin et al. |
| 5,221,642 A | 6/1993 | Burns |
| 5,222,014 A | 6/1993 | Lin |
| 5,229,647 A | 7/1993 | Gnadinger |
| 5,231,304 A | 7/1993 | Solomon |
| 5,247,423 A | 9/1993 | Lin et al. |
| 5,258,330 A | 11/1993 | Khandros et al. |
| 5,270,261 A | 12/1993 | Bertin et al. |
| 5,270,571 A | 12/1993 | Parks et al. |
| 5,279,029 A | 1/1994 | Burns |
| 5,309,326 A | 5/1994 | Minoru et al. |
| 5,311,401 A * | 5/1994 | Gates et al. ................. 361/760 |
| 5,313,096 A | 5/1994 | Eide |
| 5,330,359 A | 7/1994 | Walker |
| 5,420,751 A | 5/1995 | Burns |
| 5,422,435 A | 6/1995 | Takiar et al. |
| 5,434,745 A | 7/1995 | Shokrgozar et al. |
| 5,445,994 A | 8/1995 | Gilton |
| 5,446,620 A | 8/1995 | Burns et al. |
| 5,479,318 A | 12/1995 | Burns |
| 5,493,476 A | 2/1996 | Burns |
| 5,495,398 A | 2/1996 | Takiar et al. |
| 5,499,160 A | 3/1996 | Burns |
| 5,502,289 A | 3/1996 | Takiar et al. |
| 5,502,333 A | 3/1996 | Bertin et al. |
| 5,550,711 A | 8/1996 | Burns et al. |
| 5,552,963 A | 9/1996 | Burns |
| 5,566,051 A | 10/1996 | Burns |
| 5,600,541 A | 2/1997 | Bone et al. |
| 5,625,230 A | 4/1997 | Park et al. |
| 5,657,206 A | 8/1997 | Pedersen et al. |
| 5,675,180 A | 10/1997 | Pedersen et al. |
| 5,688,721 A | 11/1997 | Johnson |
| 5,696,031 A | 12/1997 | Wark |
| 5,698,895 A | 12/1997 | Pedersen et al. |
| 5,724,230 A | 3/1998 | Poetzinger |
| 5,891,761 A | 4/1999 | Vindasius et al. |
| 5,936,302 A | 8/1999 | Pedersen et al. |
| 5,994,170 A | 11/1999 | Pedersen et al. |
| 6,080,596 A | 6/2000 | Vindasius et al. |
| 6,098,278 A | 8/2000 | Vindasius et al. |
| 6,124,633 A | 9/2000 | Vindasius et al. |
| 6,134,118 A | 10/2000 | Pedersen et al. |
| 6,255,726 B1 | 7/2001 | Vindasius et al. |
| 6,271,598 B1 * | 8/2001 | Vindasius et al. ............ 257/777 |
| 6,973,718 B2 | 12/2005 | Sheppard, Jr. et al. |
| 6,984,885 B1 * | 1/2006 | Harada et al. ................ 257/696 |
| 7,215,018 B2 * | 5/2007 | Vindasius et al. ............ 257/686 |
| 7,245,021 B2 * | 7/2007 | Vindasius et al. ............ 257/777 |
| 2002/0185725 A1 * | 12/2002 | Moden et al. ................ 257/686 |
| 2002/0187260 A1 | 12/2002 | Sheppard et al. |

* cited by examiner

DIE ASSEMBLY HAVING ELECTRICAL INTERCONNECT

CROSS REFERENCE TO RELATED APPLICATIONS

This application is a Continuation of U.S. application Ser. No. 11/097,829, filed Mar. 31, 2005 now U.S. Pat. No. 7,245,021, titled "Micropede stacked die component assembly", which claimed priority from U.S. Provisional Application No. 60/561,848, filed Apr. 13, 2004, titled "A high density low parasitic stacked die micropede component", both of which applications are hereby incorporated herein by reference.

BACKGROUND OF THE INVENTION

The present invention relates to an apparatus for stacking and interconnecting integrated circuit die and/or multiple die segments of silicon, and interconnecting the die and or multiple die segments on the edges of the stack using an electrically conductive polymer or epoxy.

For many years, electrical components such as transistors and integrated circuits have been made using wafers of semiconductor material, including silicon and/or germanium. Integrated circuits have been provided on the wafer using various techniques known as etching, doping, and layering. Individual integrated circuits that are provided on the wafer are referred to as die, and include contact points called bond pads for external electrical connections. Typically, the die on the wafer are separated from one another by cutting the wafer along boundaries defining the die. Once the die are cut from the wafer, they are referred to as chips or die, and are packaged for use. In recent years, the proliferation of more powerful electronic systems has led to an increased need for higher performance and higher density integrated circuit packages.

One method for creating higher density packages attempts to create an entire computer system on a single wafer using wafer scale integration (WSI) techniques. WSI technology attempts to laterally wire together all the die on a wafer using wires to interconnect the die. However, in order to create the necessary interconnections between the die, many wires are required that are extremely thin and difficult to create. Furthermore, the resulting interconnected die occupy a very large area, or footprint, on the electronic systems circuit board onto which the wafer scale integration device is attached for connection into the electronic system.

A second method for creating higher density packages attempts to reduce the area required for placing the chips on a circuit board by physically stacking the chips vertically. One chip stacking technique mounts individual die on ceramic carriers, encapsulates both the die and the carrier, stacks the carriers, and then mounts the stack on a printed circuit board. In this technique, all the die in the stack are interconnected by connecting the leads of the die to the printed circuit board via metal pins. This method results in an unusually high pin count on the circuit board which reduces the reliability of the circuitry because the high pin count increases the possibility that one of the many pins may become disconnected from the board.

Another chip stacking method uses a more complex process to stack die, as disclosed in U.S. Pat. No. 5,104,820 issued Apr. 14, 1992. This method modifies individual chips so that they may be stacked by adding a pattern of metalization, called rerouting leads, to the surface of the wafer. The rerouting leads extend from the bond pads on the chip to newly formed bond pads, and are arranged so that all the rerouting leads terminate on one side of the modified chip. Each modified chip is then cut from the wafer, and assembled into a stack. The stack is assembled in a manner such that all the leads of the modified chips are aligned along the same side of the stack. The side of the stack having the leads is then etched and polished so that a cross section of the leads on each of the modified chips is accessible. After the leads are exposed, a layer of metalization is applied to the leads along the side of the stack in order to electrically connect each of the modified chips in the stack. The stack is then mounted and connected to a substrate which in turn is connected to conventional circuitry.

This method of rerouting leads offers improvement in circuit density over prior methods but is complex and expensive. In addition, the rerouting leads extend over adjacent die, which are destroyed when the modified chip is cut out of the wafer. In this method, multiple die are sacrificed for every chip that is modified.

Another method for creating higher density circuits creates stacks from entire wafers, rather than individual chips, to form a wafer array. In some devices, the wafers in the stack are electrically interconnected using solid vertical columns of metallic conductive feed-throughs, such as copper. The use of solid feed-throughs to interconnect wafers may cause damage to the array due to differential thermal coefficients of expansion during thermal cycles. Furthermore, the process is costly and makes the wafers difficult to separate for repairs.

Other methods also exist to interconnect stacks of wafers, as disclosed in, for example, U.S. Pat. No. 4,897,708 issued Jun. 30, 1990, and U.S. Pat. No. 4,954,875 issued Sep. 4, 1990. These methods provide each wafer in the stack with coned-shaped through-holes which expose bonding pads on the wafers. The bond pads of the wafers in the stack are then electrically connected by either filling the through holes with electrically conductive liquid, or inserting an electrically conductive compliant material into the through holes, to provide a continuous vertical electrical connection between the wafers. While avoiding the disadvantages of using solid vertical columns of metal to interconnect wafers, the use of electrically conductive liquids and conductive materials requires special tooling to fill the through holes. Furthermore, for some applications, it may not be desirable to use stacks of entire wafers due to size constraints of the electrical device.

Individual semiconductor die are typically assembled in packages that allow the integrated circuit die to be attached to printed circuit boards and to allow electrical connections to be made between the integrated circuit die. There are many types of packages that are used for this purpose. The BGA package and the TSOP package are 2 types of packages in common use for assembling memory die and mounting the assembled die on a printed circuit board. There are a number of methods for stacking packaged integrated circuits, but in general, they suffer from a size disadvantage, and a performance disadvantage, due to the added electrical parasitics arising from the necessary lengths and characteristics of the inter-package interconnections. Due to the large physical size of the packages, there is a limit to the number of packages which may be stacked on top of each other, typically 2, to avoid thermo-mechanical problems. Stacks of packaged integrated circuits have been recently popular but take up too much board space, are too thick, and will not operate at the high speeds being required by advanced memory devices such as DDR2 and DDR3 DRAM.

SUMMARY OF THE INVENTION

Accordingly, it is an object of the present invention to provide an improved method and apparatus for stacking and interconnecting integrated circuit die and multiple die segments.

The present invention provides an apparatus for vertically interconnecting semiconductor die, integrated circuit die, or multiple die segments. Metal rerouting interconnects which extend to one or more sides of the die or segment can be optionally added to the die or multi die segment to provide edge bonding pads upon the surface of the die for external electrical connection points. After the metal rerouting interconnect has been added to the die on the wafer, the wafer is optionally thinned and each die or multiple die segment is singulated from the wafer by cutting or other appropriate singulation method. After the die or multiple die segments are singulated or cut from the wafer, insulation is applied to all surfaces of the die or multiple die segments, openings are made in the insulation above the desired electrical connection pads, and the die or multiple die segments are placed on top of one another to form a stack. Vertically adjacent segments in the stack are electrically interconnected by attaching a short flexible bond wire or bond ribbon to the exposed electrical connection pad at the peripheral edges of the die which protrudes horizontally from the die and applying electrically conductive polymer, or epoxy, filaments or lines to one or more sides of the stack.

According to a further aspect of the present invention, a thermally conductive epoxy preformed sheet is provided so that the stack of segments are epoxied together. The thermally conductive epoxy preform includes a plurality of glass spheres randomly distributed within the preform.

Other objects, features and advantages of the present invention will become apparent from the following detailed description when taken in conjunction with the accompanying drawings.

DETAILED DESCRIPTION OF THE INVENTION

Figure 1:
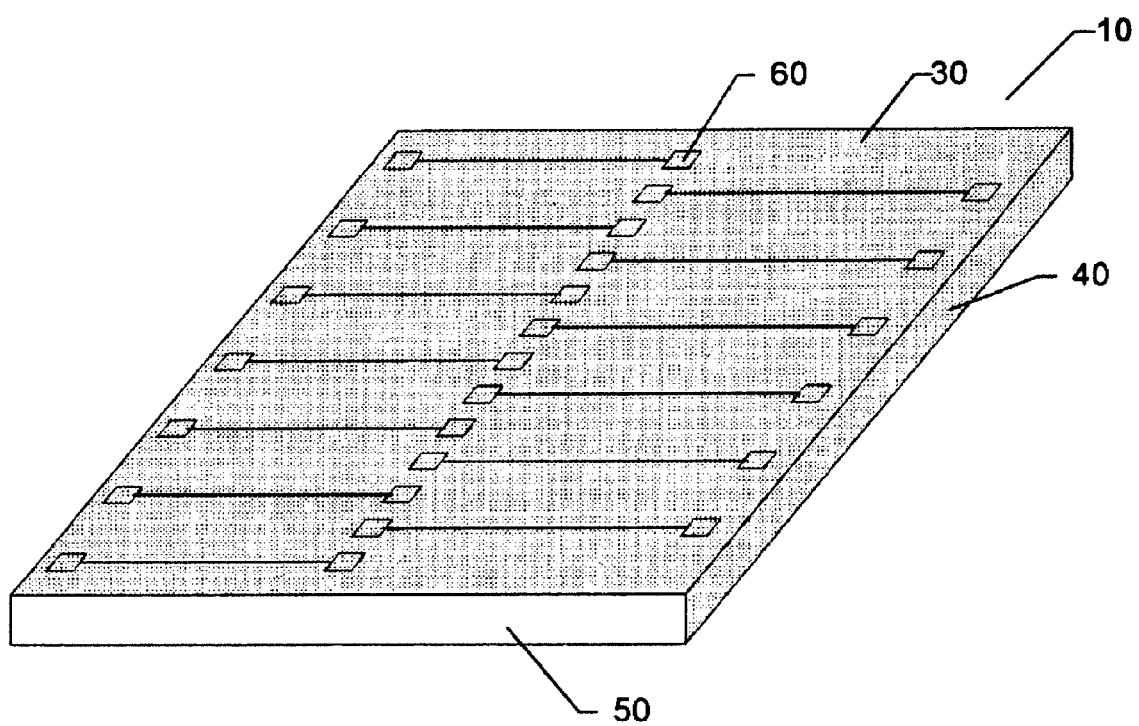
FIG. 1 is a diagram illustrating a single semiconductor die with original connection pads running down the center of the die, and rerouting lines connecting the original connection pads at the center of the die with new connection pads located at the edges of the die.

Referring to FIG. 1, semiconductor die 10, with original connection pads 60 have had an insulating layer applied to the top surface, 30 of all of the die while the die are still connected together in a wafer form. A metal layer is deposited and defined using photolithography, to reroute the electrical signals from the original connection pads 60 to new locations at the edge of the die. An additional layer of insulating material is optionally applied above the metal layer, and openings are made in the top layer of insulating material at the relocated pad locations at the edge of the semiconductor die, and optionally at the original pad locations down the center of the top surface of the die.

Figure 2:
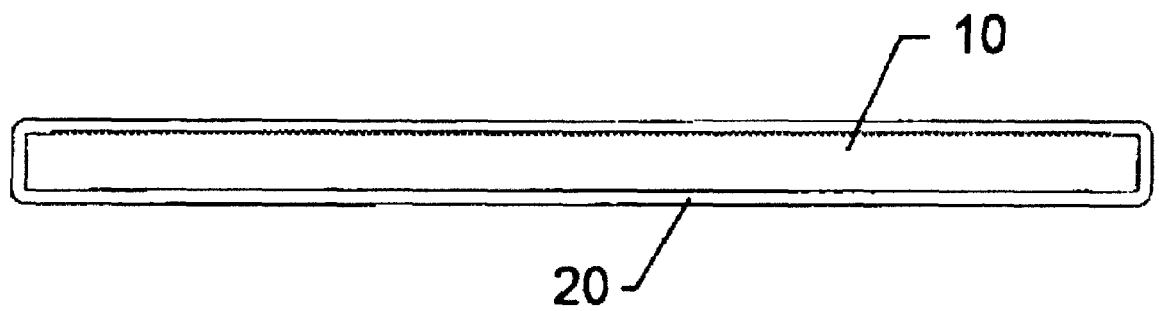
FIG. 2 is a diagram illustrating a cross sectional side view of a semiconductor die showing the die coated with a conformal, insulating coating.

Referring to FIG. 2, the semiconductor die, 10, has been thinned by grinding or lapping, and has been singulated from the semiconductor wafer, and said semiconductor die has been coated with a conformal insulating coating 20.

Figure 3:
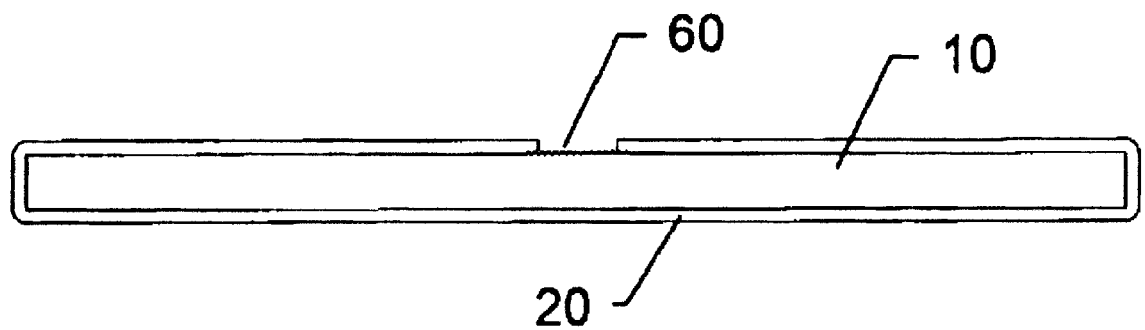
FIG. 3 is a diagram illustrating a cross section view of the semiconductor die showing the conformal coating and openings in the conformal coating above the original connection pads which run down the center of the semiconductor die.

Referring to FIG. 3, openings have been made in the coating, 20, above original connection pads, 60, of semiconductor die, 10.

Figure 4:
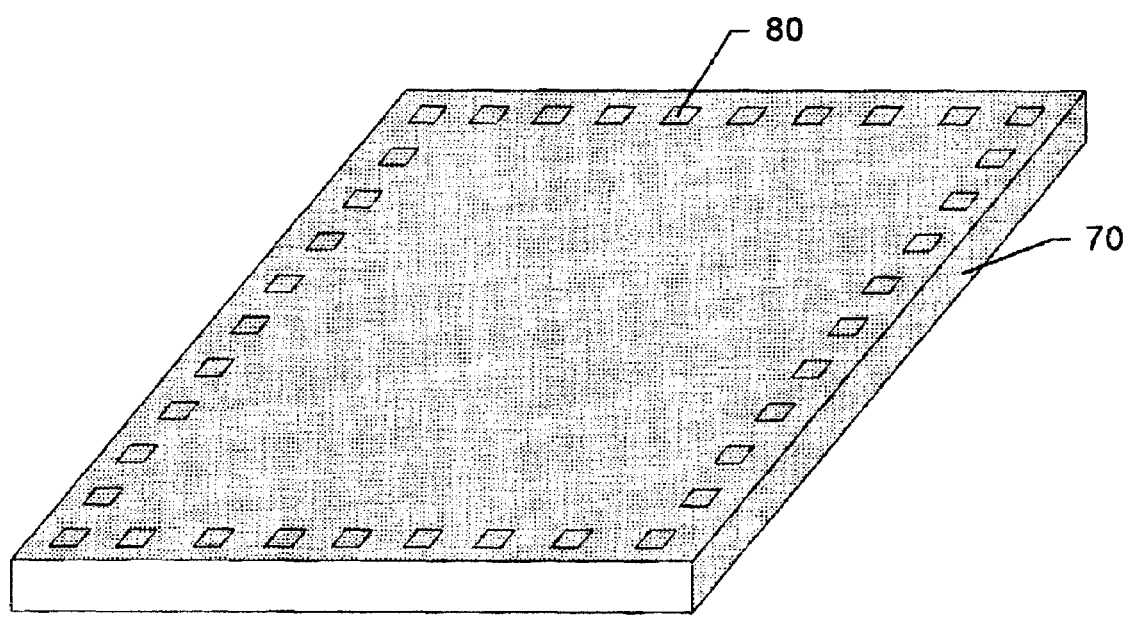
FIG. 4 shows a semiconductor die with connection pads around the periphery of the die.

Referring to FIG. 4, this shows a semiconductor die 70 with connection pads 80 located around the periphery of the die top surface.

Figure 5:
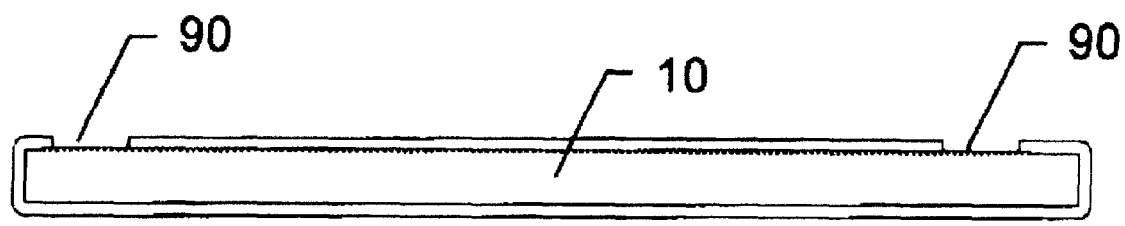
FIG. 5 shows a semiconductor die with peripheral pads, either original or relocated, coated with a conformal insulative coating, and with openings in the insulative coating located above the peripherally located electrical connection pads.

Referring to FIG. 5, this shows openings in the conformal coating material at locations 90 on a semiconductor die whose electrical connections are located at the edges of the surface of the die.

Figure 6:
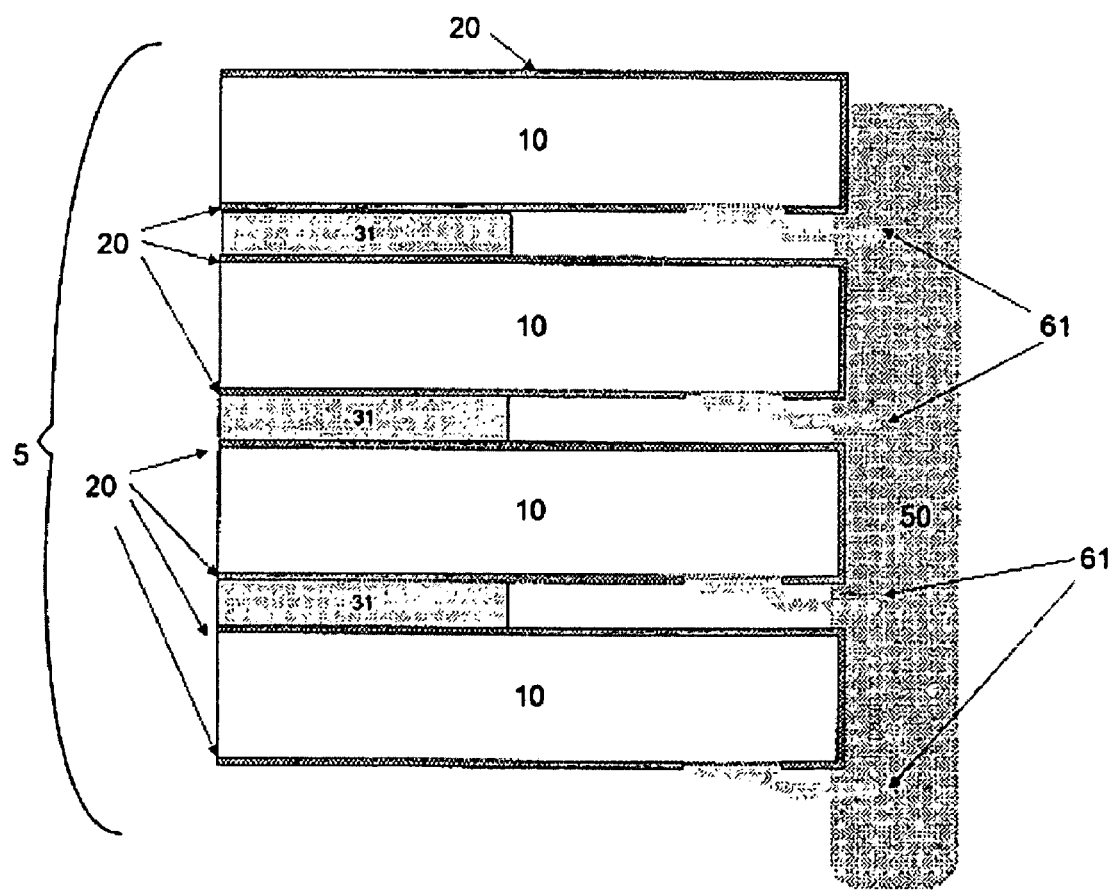
FIG. 6 is a cross section drawing of a completed 4-high stack, ready to be mounted on and connected to an appropriate substrate.

FIG. 6 depicts the vertical stack assembly component 5, consisting of semiconductor die 10, with conformal coating 20. The semiconductor die 10 having metallic conducting elements 61, one end of which are connected to electrical connection points at the periphery of the die 10, and the other end of the metallic conducting elements are embedded in the vertical conducting polymer 50. The vertical conductive polymer 50 is adjacent to the edge of the stack of the die and electrically connects the die to the top electrical conducting surface, 94, on the substrate 7.

Also shown in FIG. 6 is the epoxy perform 31 used to laminate the die 10 to each other in a stack by bonding to the conformal coating 20 on each of the die.

FIG. 6 shows the stack of die 10 laminated to each other with epoxy perform 30, and connected electrically by horizontal conducting elements 61 to vertical conducting element Vertical conducting elements 50 extend past the bottom of the die stack and are available for electrical and physical attachment to a substrate upon which the die stack will be mounted.

The foregoing has described a high density, low parasitic stacked die assembly. It should be apparent that numerous and various components can be utilized with the present invention, as described below.

For instance, the present invention can comprise a stack of semiconductor or integrated circuit die laminated to each other. The die can optionally have one or more metal rerouting layers to interconnect the original die connection pads with new connection locations at the edge of the top surface of the die. The new connection locations are desirable for vertical interconnection.

The die can have a conformal, insulating coating, where the coating can be a polymer. The polymer coating can parylene, and the insulating coating can have openings above specific new connection locations at the edge of the top surface of the die as required by the specific component design.

The openings can be made, for example, by removing the polymer with laser ablation, and by removing the polymer with a plasma etcher.

The openings can be made by preventing the deposition of the polymer coating in selective areas above connection pads on the die. The die can be laminated on top of each other with an electrically insulating polymer or epoxy preform. The insulating preform can be thermally conductive.

The insulating preform optionally can include spheres to maintain a fixed spacing or separation between the semiconductor die after lamination. The spheres can be made of glass, ceramic, quartz, plastic, Teflon, polymer, or having a metal coating.

The electrically insulating polymer can be an epoxy. The die can be laminated on top of each other with a liquid polymer that is cured to form a solid bond between the layers in the stack. The insulating polymer can optionally include spheres to maintain a fixed spacing or separation between the semiconductor die after lamination, where the spheres can be made of glass, ceramic, quartz, plastic, Teflon, a polymer, and/or a metal coating.

The electrically insulating polymer can consist of epoxy, where the die can be any semiconductor die, such as memory die, where the memory die can be SDRAM, DDR-1, DDR-2, DDR-3, or any other DRAM. The memory die can be NAND Flash, NOR Flash, M-RAM, F-RAM, E2 or any other Non-Volatile Memory. The memory die can be SRAM.

The stack can be electrically connected vertically, where the vertical electrical connection comprises a conductive polymer. The conductive polymer can be a conductive epoxy, such as silver filled (having particles of silver mixed with the polymer), gold filled (having particles of gold mixed with the polymer), the conductive epoxy being filled with metallic particles (having particles of metal mixed with the polymer).

The electrical connection can include one or more metallic conducting elements bonded to the relocated pad locations on the surface of each die and extending, both physically and electrically from the relocated pad into the vertical conductor so that one end of the conductor is embedded within the conductive polymer. The metallic conducting elements can be a bond wire, bond ribbon. The metallic conducting element can be gold, aluminum, copper, or palladium, on any combination of conducting materials such as gold, aluminum, copper, or palladium. The metallic conducting elements can exist as a metal lead frame with tie bars which is bonded to the die, and after which the tie bars of metal are removed to leave individual metal conducting elements or leads bonded to the connection pads on the die. The frame can be formed by excising holes in a thin plate of metal. The frame can be cut to remove a center ring or picture frame, leaving behind metal leads ready to attach to the bonding pads on the die, or the frame can be cut to remove an outer ring or picture frame after the leads have been bonded to the connection pads on the die.

All of the connection pads can be "gang-bonded" simultaneously to the connection pads on the die. The electrical connections can be used selectively to program, or route unique signals to unique layers of semiconductor die within the stack of semiconductor die as required by the specific component design. The electrical connections can be connected to the corresponding connection on one or more other die in the stack to connect signals of each of the semiconductor die in the stack in common, as required by the specific component design. The electrical connections can be fanned out so the similar electrical connections from different die in the stack are available at separate, unique connection points on the module (in other words "not in common").

The assembly can be without any additional coating, molding, or covering over the die, and vertical connections. The top die of the assembly can be covered with a material to block or attenuate light from impinging on and affecting the semiconductor die in the assembly. The assembly can be coated with a conformal polymer, such as parylene, where the conformal coating can be the final coating of the device.

The assembly can be over-molded with a polymer, plastic, or epoxy to completely coat and cover the stack of semiconductor die, leaving the connections that extend at the bottom of the substrate uncovered and exposed for electrical connection.

The stacked die assembly is suitable for high speed circuitry due to the component having low inductance, low capacitance, low DC resistance, and/or matched AC Impedance. The component optionally can have ground and power planes included in the substrate and or the die.

What is claimed is:

1. A semiconductor die assembly, comprising an unencapsulated die having peripheral electrical connection sites and comprising a plurality of electrically conductive polymer elements electrically connected to a plurality of said peripheral electrical connection sites, wherein the electrically conductive polymer element is electrically connected to the electrical connection site by way of a conducting element electrically connected to the connection site on the die and extending away from the die into the electrically conductive polymer element.

2. The assembly of claim 1, comprising at least two said die, wherein an interconnection site on a first one of said die is electrically connected to an interconnection site on a second one of said die by an electrically conductive polymer element.

3. The assembly of claim 1, wherein the peripheral interconnection sites include original peripheral die pads.

4. The assembly of claim 1, wherein said die is rerouted to connect original die pads to peripheral interconnection sites.

5. The assembly of claim 2, wherein the peripheral interconnection sites on at least one of said die include original peripheral die pads.

6. The assembly of claim 2, wherein at least one of said die is rerouted to connect original die pads to peripheral interconnection sites.

7. The assembly of claim 1, further comprising an electrical insulator situated at least between the die and the electrically conductive polymer element.

8. The assembly of claim 7, wherein the electrical insulator comprises a conformal coating.

9. The assembly of claim 8, wherein the conformal coating has openings above selected ones of the interconnection sites.

10. The assembly of claim 8, wherein the conformal coating comprises a polymer.

11. The assembly of claim 10, wherein the conformal coating comprises parylene.

12. The assembly of claim 2, further comprising an electrical insulator between at least one said die and the electrically conductive polymer element.

13. The assembly of claim 12, wherein the electrical insulator comprises a conformal coating.

14. The assembly of claim 13, wherein wherein the insulating coating has openings above selected ones of the interconnection sites.

15. The assembly of claim 13, wherein wherein the conformal coating comprises a polymer.

16. The assembly of claim 15, wherein wherein the conformal coating comprises parylene.

17. The assembly of claim 1, wherein the electrically conductive polymer element comprises a filament.

18. The assembly of claim 1, wherein the electrically conductive polymer element comprises a line.

19. The assembly of claim 1, wherein the electrically conductive polymer element is oriented generally perpendicular to the die mount side of the substrate a surface of said die.

20. The assembly of claim 1, wherein the electrically conductive polymer element comprises a conductive epoxy.

21. The assembly of claim 1, wherein the electrically conductive polymer element comprises a filled epoxy.

22. The assembly of claim 1, wherein the electrically conductive polymer element comprises a silver filled epoxy.

23. The assembly of claim 1, wherein the electrically conductive polymer element comprises a gold filled epoxy.

24. The assembly of claim 1, wherein the conducting element comprises a bond wire.

25. The assembly of claim 1, wherein the conducting element comprises a bond ribbon.

26. The assembly of claim 1, wherein the conducting element comprises a metal.

27. The assembly of claim 1, wherein the conducting element comprises one of gold, aluminum, copper and palladium, and a combination thereof.

28. The assembly of claim 1, wherein at least one of said die is a memory die.

29. The assembly of claim 1, wherein the electrically conductive polymer element extends beyond at least one surface of a die in the assembly.

30. A semiconductor die assembly, comprising uncapsulated die stacked one over another, each said die having peripheral electrical connection sites, the assembly further comprising an electrically conductive polymer element electrically connected to at least one said electrical connection site by way of a conducting element electrically connected to the connection site on the die and extending away from the die into the electrically conductive polymer element.

31. The assembly of claim 30, wherein said conductive polymer element is electrically connected to fewer than all of said die.

32. The assembly of claim 30, wherein said conductive polymer element is electically connected to fewer than all of said die.

33. The assembly of claim 30, wherein adjacent die in the stack are laminated one to another using an electrically insulating material.

34. The assembly of claim 33, wherein the electrically insulating material comprises a thermally conductive material.

35. The assembly of claim 33, wherein the electrically insulating material comprises a polymer.

36. The assembly of claim 33, wherein the electrically insulating material comprises an epoxy.

37. The assembly of claim 33, wherein the electrically insulating material comprises an epoxy preform.

38. The assembly of claim 33, wherein the electrically insulating material comprises a portion of a conformal die coating.

39. The assembly of claim 38, wherein the conformal die coating comprises parylene.

40. The assembly of claim 33, wherein the electrically insulating material includes spacers.

41. The assembly of claim 33, wherein the electrically insulating material includes spherical spacers.

42. The assembly of claim 40, wherein the spacers comprise one of: glass, ceramic, plastic, Teflon, a polymer, quartz, and combinations thereof.

43. The assembly of claim 35, wherein the electrically insulating material further comprises spacers.

44. The assembly of claim 43, wherein the spacers comprise spheres.

45. The assembly of claim 43, wherein the spacers comprise one of: glass, ceramic, plastic, Teflon, a polymer, quartz, and combinations thereof.

46. The assembly of claim 34, wherein the electrically insulating material further comprises spacers.

47. The assembly of claim 46, wherein the spacers comprise spheres.

48. The assembly of claim 47, wherein the spacers comprise one of: glass, ceramic, plastic, Teflon, a polymer, quartz, and combinations thereof.

49. The assembly of claim 37, wherein the epoxy preform comprises spacers.

50. The assembly of claim 49, wherein the spacers comprise spheres.

51. The assembly of claim 50, wherein the spacers comprise one of: glass, ceramic, plastic, Teflon, a polymer, quartz, and combinations thereof.

52. The assembly of claim 30, wherein at least one said die is oriented such that the active side of the die faces away from a first said die.

53. The assembly of claim 30, wherein at least one said die is oriented such that the active side of the die faces toward a first said die.

54. The assembly of claim 30, wherein the active side of at least two said die face in the same direction.

* * * * *

UNITED STATES PATENT AND TRADEMARK OFFICE
CERTIFICATE OF CORRECTION

PATENT NO. : 7,535,109 B2  Page 1 of 1
APPLICATION NO. : 11/744153
DATED : May 19, 2009
INVENTOR(S) : Marc E. Robinson et al.

It is certified that error appears in the above-identified patent and that said Letters Patent is hereby corrected as shown below:

In claim 19, column 7, line 3, delete "the die mount side of the substrate"

In claim 30, column 7, line 26, delete "uncapsulated" and insert --at least two unencapsulated--

In claim 32, column 7, line 38, delete "fewer than all" and insert --at least two--

Signed and Sealed this

Twenty-third Day of June, 2009

JOHN DOLL
*Acting Director of the United States Patent and Trademark Office*